United States Patent
Chen et al.

(10) Patent No.: US 9,269,658 B2
(45) Date of Patent: Feb. 23, 2016

(54) BALL AMOUNT PROCESS IN THE MANUFACTURING OF INTEGRATED CIRCUIT

(71) Applicant: Taiwan Semiconductor Manufacturing Company, Ltd., Hsin-Chu (TW)

(72) Inventors: Hsien-Wei Chen, Hsin-Chu (TW); Tsung-Yuan Yu, Taipei (TW); Wen-Hsiung Lu, Jhonghe (TW); Ming-Da Cheng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/189,434

(22) Filed: Feb. 25, 2014

(65) Prior Publication Data

US 2014/0252611 A1    Sep. 11, 2014

Related U.S. Application Data

(60) Provisional application No. 61/776,686, filed on Mar. 11, 2013.

(51) Int. Cl.

| H01L 23/48 | (2006.01) |
|---|---|
| H01L 23/498 | (2006.01) |
| H01L 23/31 | (2006.01) |
| H01L 23/525 | (2006.01) |
| H01L 21/56 | (2006.01) |
| H01L 23/00 | (2006.01) |
| H01L 21/768 | (2006.01) |

(52) U.S. Cl.
CPC ........ *H01L 23/49816* (2013.01); *H01L 21/566* (2013.01); *H01L 23/3114* (2013.01); *H01L 23/3192* (2013.01); *H01L 23/525* (2013.01); *H01L 24/03* (2013.01); *H01L 24/05* (2013.01); *H01L 24/11* (2013.01); *H01L 24/13* (2013.01); *H01L 21/76888* (2013.01); *H01L 2224/02331* (2013.01); *H01L 2224/0345* (2013.01); *H01L 2224/03828* (2013.01); *H01L 2224/05008* (2013.01); *H01L 2224/05548* (2013.01); *H01L 2224/05552* (2013.01); *H01L 2224/05582* (2013.01); *H01L 2224/05583* (2013.01); *H01L 2224/05647* (2013.01); *H01L 2224/1191* (2013.01); *H01L 2224/11334* (2013.01); *H01L 2224/11849* (2013.01); *H01L 2224/13006* (2013.01); *H01L 2224/13022* (2013.01); *H01L 2224/13027* (2013.01); *H01L 2224/94* (2013.01); *H01L 2924/181* (2013.01)

(58) Field of Classification Search
CPC .............. H01L 23/49816; H01L 24/05; H01L 23/49811; H01L 23/3128
See application file for complete search history.

(56) References Cited

U.S. PATENT DOCUMENTS

| 2004/0053483 A1* | 3/2004 | Nair et al. ...................... 438/540 |
| 2011/0198753 A1* | 8/2011 | Holland ......................... 257/738 |
| 2013/0228897 A1* | 9/2013 | Chen et al. .................... 257/621 |

*Primary Examiner* — Khiem D Nguyen

(74) *Attorney, Agent, or Firm* — Slater & Matsil, L.L.P.

(57) ABSTRACT

An integrated circuit structure includes a semiconductor substrate, a metal pad over the semiconductor substrate, a passivation layer including a portion over the metal pad, a polymer layer over the passivation layer, and a Post-Passivation Interconnect (PPI) over the polymer layer. The PPI is electrically connected to the metal pad. The PPI includes a PPI line have a first width, and a PPI pad having a second width greater than the first width. The PPI pad is connected to the PPI line. The PPI pad includes an inner portion having a first thickness, and an edge portion having a second thickness smaller than the first thickness.

20 Claims, 10 Drawing Sheets

BALL AMOUNT PROCESS IN THE MANUFACTURING OF INTEGRATED CIRCUIT

PRIORITY CLAIM AND CROSS-REFERENCE

This application claims the benefit of the following provisionally filed U.S. Patent application: application Ser. No. 61/776,686, filed Mar. 11, 2013, and entitled "Methods and Apparatus of Packaging of Semiconductor Devices," which application is hereby incorporated herein by reference.

BACKGROUND

In the integrated circuit manufacturing process, integrated circuit devices, such as transistors, are first formed at the surface of a semiconductor substrate in a wafer. An interconnect structure is then formed over the integrated circuit devices. Metal pads are formed over, and are electrically coupled to, the interconnect structure. A passivation layer and a first polymer layer are formed on the metal pads, with the metal pads exposed through the openings in the passivation layer and the first polymer layer. A Post-Passivation Interconnect (PPI) structure is then formed, which includes redistribution lines connected to the metal pads. A second polymer layer is then formed over the PPI. Under-Bump-Metallurgies (UBMs) are formed to extend into the openings in the second polymer layer, wherein the UBMs are electrically connected to the PPI. Solder balls are then placed over the UBMs and reflowed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A wafer and the respective dies, and the method of forming the same are provided in accordance with various exemplary embodiments. The intermediate stages of forming the wafer and dies are illustrated. The variations of the wafer and dies in accordance with some embodiments are discussed. Throughout the various views and illustrative embodiments, like reference numbers are used to designate like elements.

Figure 1:
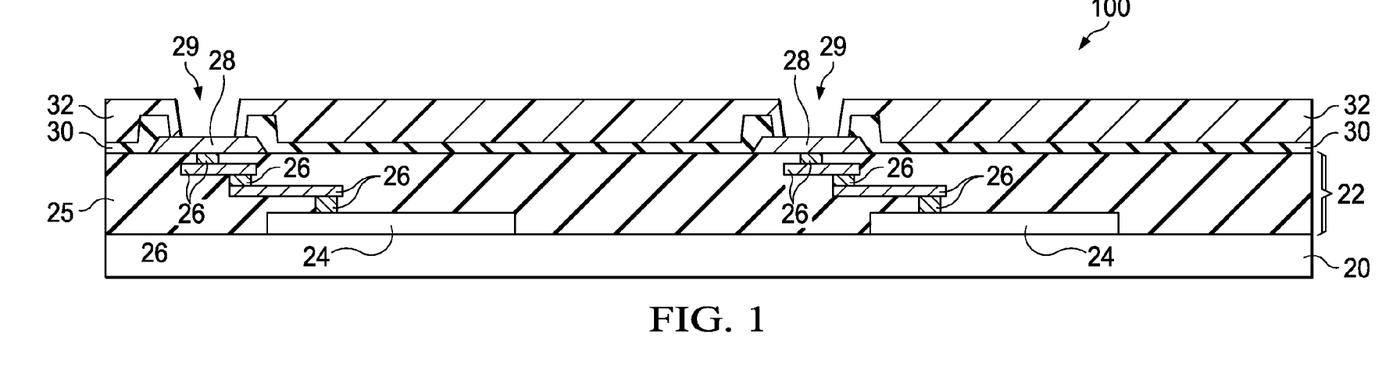
FIGS. 1 through 13 are cross-sectional views and top views of intermediate stages in the manufacturing of a wafer and the respective dies in accordance with some exemplary embodiments.

Referring to FIG. 1, wafer 100 is provided. Wafer 100 includes substrate 20, which may be a semiconductor substrate, such as a silicon substrate, although it may be formed of other semiconductor materials including, and not limited to, silicon germanium, silicon carbon, gallium arsenide, or the like. In some embodiments, wafer 100 is a device wafer, and semiconductor devices 24 (such as transistors) are formed at the surface of substrate 20. Interconnect structure 22, which includes metal lines and vias 26 formed therein, is formed over substrate 20. Metal lines and vias 26 are electrically coupled to semiconductor devices 24. Metal lines and vias 26 may be formed of copper or copper alloys, and may be formed using damascene processes. Interconnect structure 22 may include a plurality of dielectric layers 25, which may include an Inter-Layer Dielectric (ILD, not shown) and Inter-Metal Dielectrics (IMDs, not shown), with metal lines and vias 26 disposed in dielectric layers 25. In alternative embodiments, wafer 100 is an interposer wafer or a package substrate, and is substantially free from integrated circuit devices therein, which integrated circuit devices include transistors, resistors, capacitors, inductors, and/or the like.

Metal pads 28 are formed over interconnect structure 22. Metal pads 28 may comprise aluminum (Al), copper (Cu), silver (Ag), gold (Au), nickel (Ni), tungsten (W), alloys thereof, and/or multi-layers thereof. Metal pads 28 may be electrically coupled to semiconductor devices 24, for example, through metal lines and vias 26. Passivation layer 30 may be formed to cover edge portions of metal pad 28. In some exemplary embodiments, passivation layer 30 comprises a silicon oxide layer and a silicon nitride layer over the silicon oxide layer, although other dielectric materials such as Un-doped Silicate Glass (USG) may be used. Openings 29 are formed in passivation layer 30, and hence the central portions of metal pads 28 are exposed through openings 29.

Polymer layer 32 is formed over passivation layer 30, wherein polymer layer 32 extends into openings 29 in passivation layer 30. Polymer layer 32 may include a photo sensitive material in accordance with some embodiments. For example, the material of polymer layer 32 includes, and is not limited to, polyimide, polybenzoxazole (PBO), or the like. Polymer layer 32 is also patterned to form additional openings, so that metal pads 28 are exposed.

Figure 2:
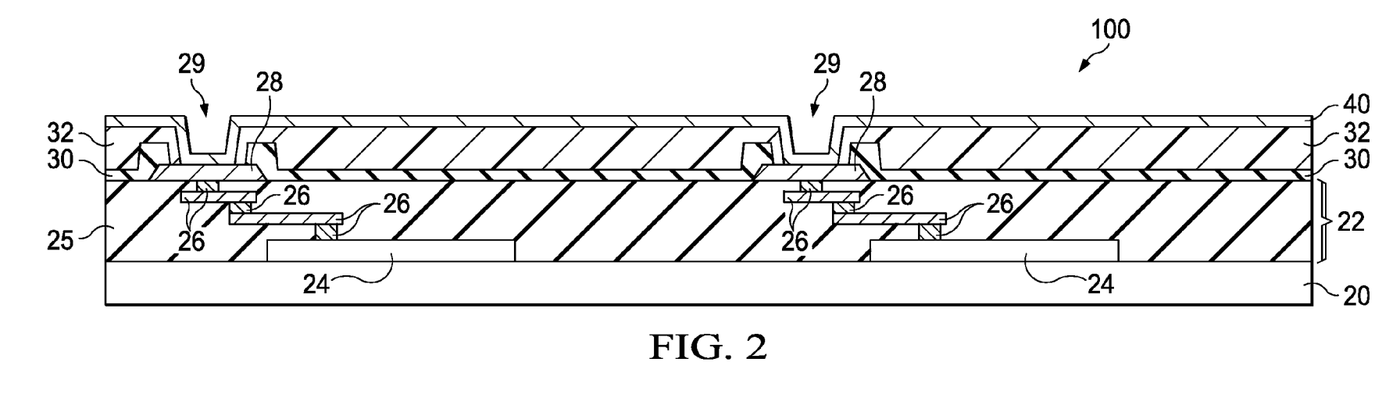

Next, as shown in FIG. 2, seed layer 40 is formed over polymer layer 32. In some embodiments, seed layer 40 is a composite layer comprising a plurality of layers. For example, seed layer 40 may include a bottom layer and an upper layer (not shown), wherein the bottom layer includes a titanium layer, a titanium nitride layer, a tantalum layer, a tantalum nitride layer, or the like. The materials of the upper layer may include copper or a copper alloy. In alternative embodiments, seed layer 40 may be a single layer, which may be a copper layer, for example. Seed layer 40 may be formed using Physical Vapor Deposition (PVD), while other applicable methods may also be used.

Figure 3:
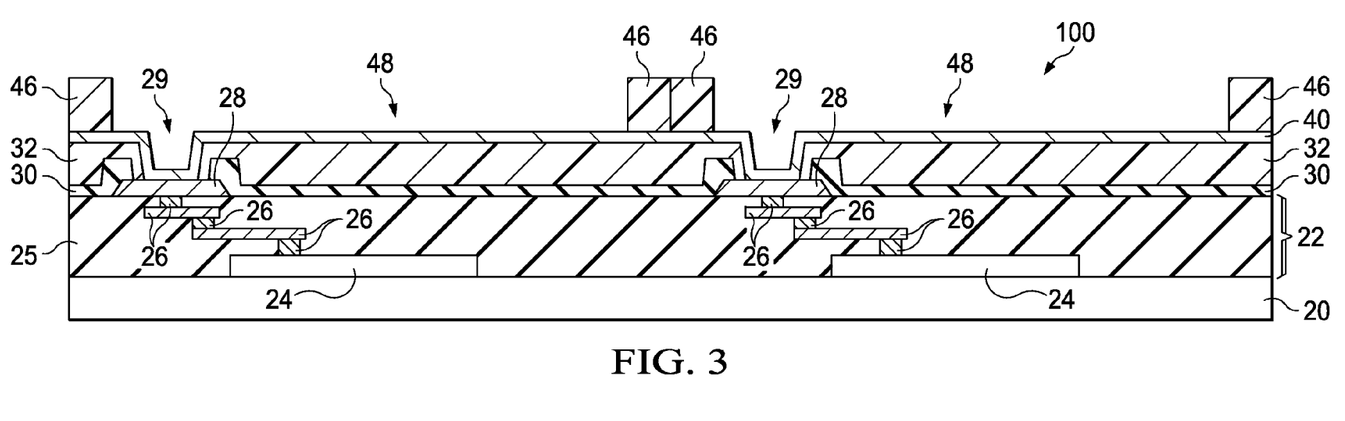
Figure 4:
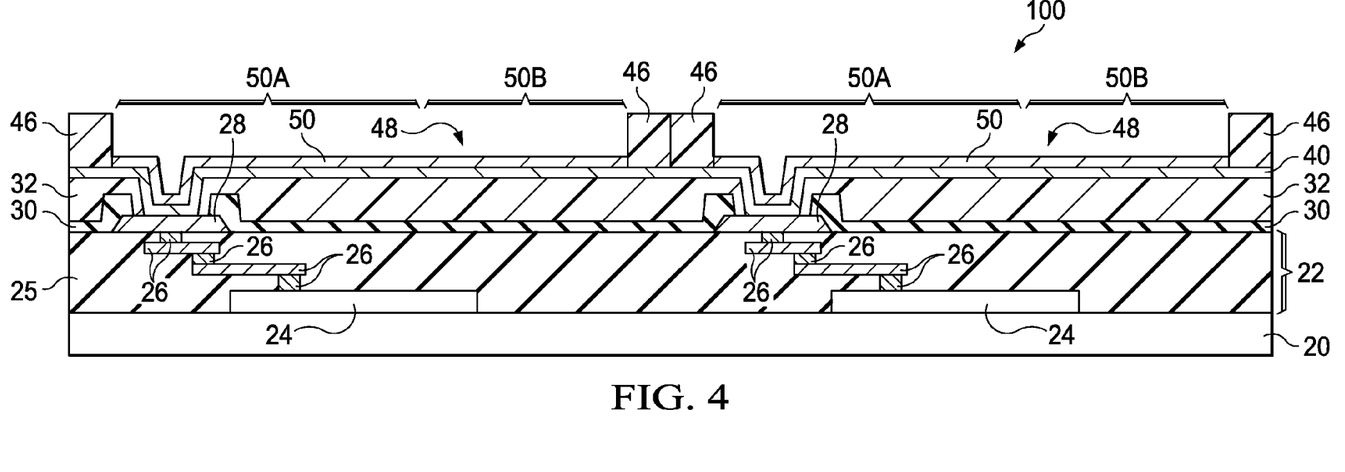

FIG. 3 illustrates the formation of mask 46. In some embodiments, mask 46 is formed of a photo resist, and hence is alternatively referred to as photo resist 46 throughout the description, although other materials may be used. Mask 46 is patterned to form openings 48, through which some portions of seed layer 40 are exposed. Next, a plating step is performed to form Post-Passivation Interconnects (PPIs) 50 in opening 48, as shown in FIG. 4. PPIs 50 may comprise a copper-containing layer including copper or a copper alloy. PPIs 50 includes PPI lines 50A and PPI pads 50B, wherein PPI pads 50B are wider than the respective connecting PPI lines 50A. In alternative embodiments, PPIs 50 comprise a nickel-containing layer, a palladium-containing layer, and/or the like, in additional to the copper-containing layer.

Figure 5A:
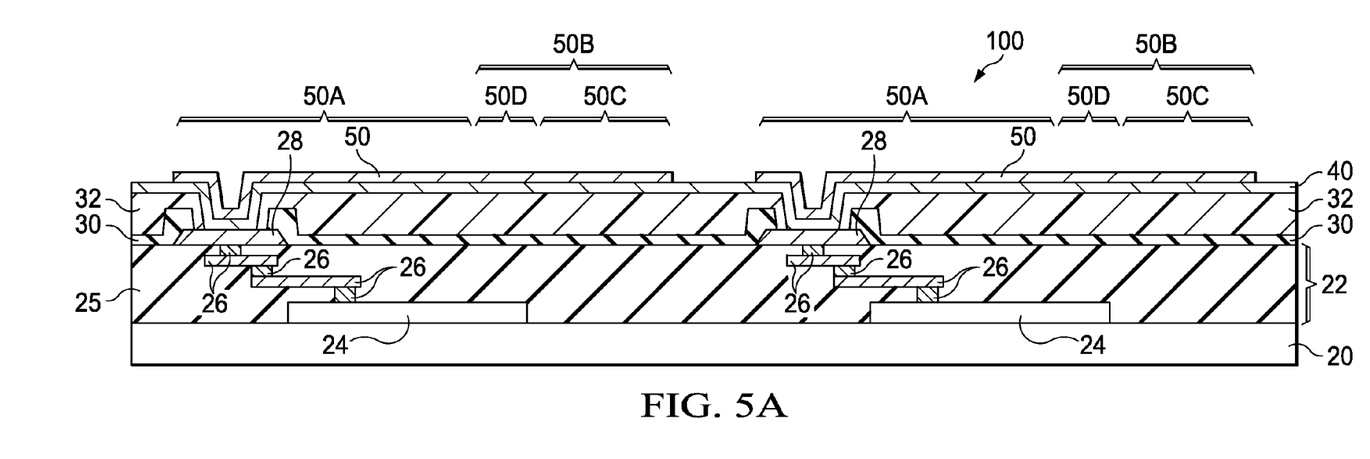
Figure 6:
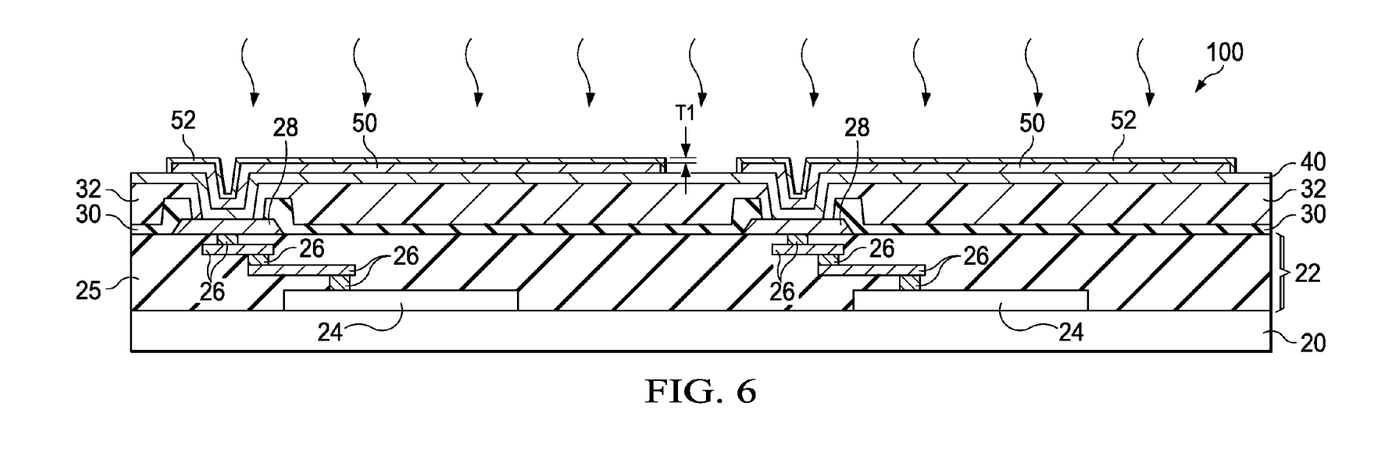

In FIG. 5A, photo resist 46 is removed in a photo resist stripping process. Next, as shown in FIG. 6, the exposed portions of seed layer 40 that were previously covered by photo resist 46 are removed through etching, while the portions of seed layer 40 covered by PPIs 50 remain un-removed. Throughout the description, the subsequently referred PPIs 50 also include the remaining portions of seed layer 40.

Figure 5B:
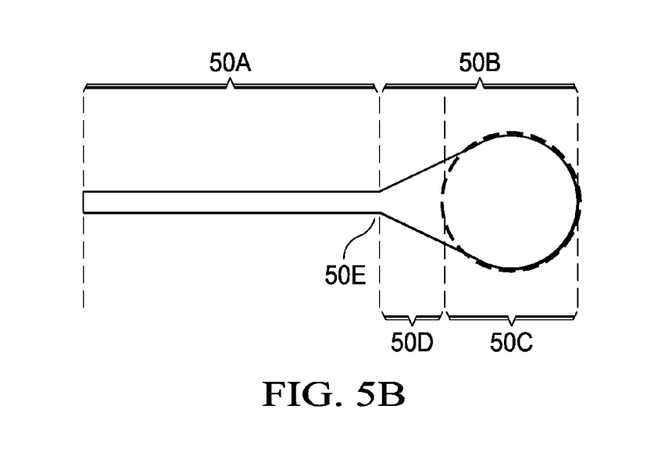

FIG. 5B illustrates a top view of an exemplary PPI 50, which includes PPI line 50A and PPI pad 50B connected to PPI pad 50A. Throughout the description, the connecting region at which PPI line 50A and PPI pad 50B are connected to each other is referred to as neck region 50E. PPI pad 50B further includes main pad region 50C, and bird-beak region 50D connecting main pad region 50C to PPI line 50A. In accordance with some embodiments, main pad region 50C has a round top-view shape. In alternative embodiments, main pad region 50C may have other applicable shapes including, and not limited to, rectangles, hexagons, octagons, and the like. Bird-Beak region 50D is the region that has widths gradually and/or continuous changes from the width of main pad region 50C to the width of PPI line 50A.

FIG. 6 illustrates an oxidation step to oxidize the exposed surface portion of PPIs 50, so that metal oxide layers 52 are formed. Metal oxide layers 52 include top surface portions over the top surface of PPIs 50, and sidewall portions on the sidewalls of PPIs 50. When PPIs 50 comprise copper, metal oxide layers 52 may comprise copper oxide. In accordance with some embodiments, the oxidation is performed in a chamber in which process gas including oxygen-containing gases (such as oxygen ($O_2$)) are provided. Plasma may or may not be generated from the process gases. Furthermore, argon may be included in the process gas in some embodiments. The oxidation temperature may be higher than about 80° C., and may be between about 80° C. and about 200° C. The oxidation may last for a period of time in the range between about 30 seconds and about 3.5 minutes. In the embodiments in which argon is provided, argon is used to lightly bombard the surfaces of PPIs 50, so that the surfaces become rough. This may results in the increase in the oxidation rate and/or the thickness of the resulting oxide layers 52.

In accordance with some embodiments, the thickness T1 of oxide layer 52 is greater than about 0.5 μm, greater than about 1 μm, or greater than about 2 μm. The oxidation process results in the thickness T1 of metal oxide layer 52 to be greater than the thickness (referred to as T2, not shown) of the native oxide, if any, that otherwise may be form on PPIs 50. In accordance with some embodiments, the process conditions for the oxidation are controlled, so that ratio T1/T2 is greater than 2.0, and may be in the range between about 2.0 and about 10. Since the formation of native oxide saturates quickly, its thickness is limited, particularly in the controlled environment for forming integrated circuits. For example, in the case that the oxidation process is not performed, the native oxide, if any, on PPIs 50 would have had a thickness smaller than about 0.2 μm.

Figure 7A:
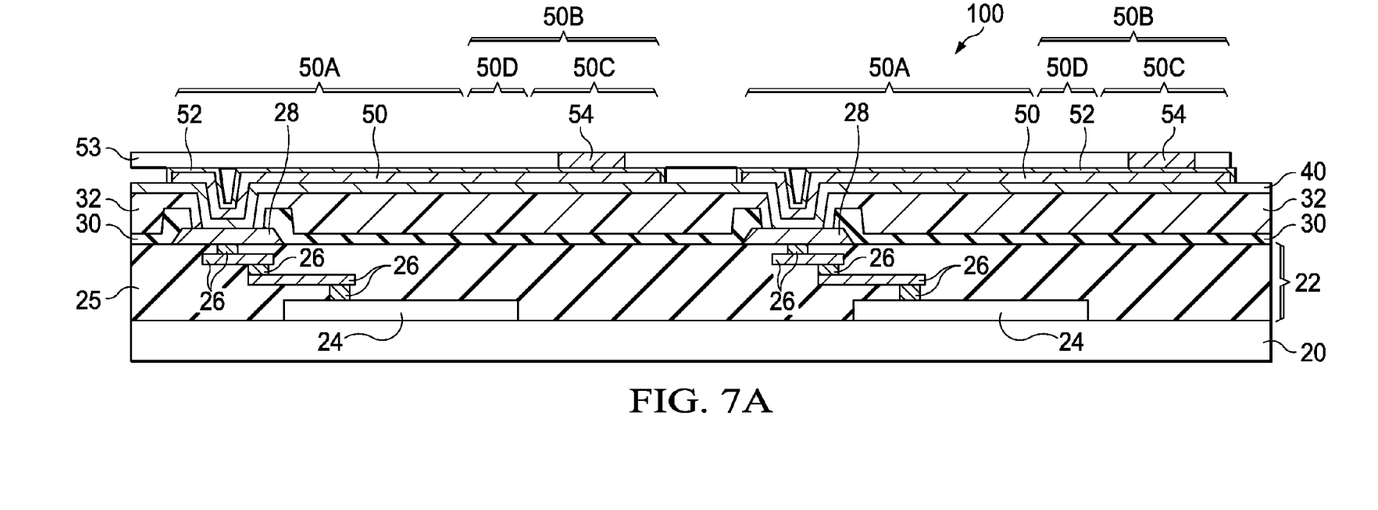
Figure 7B:
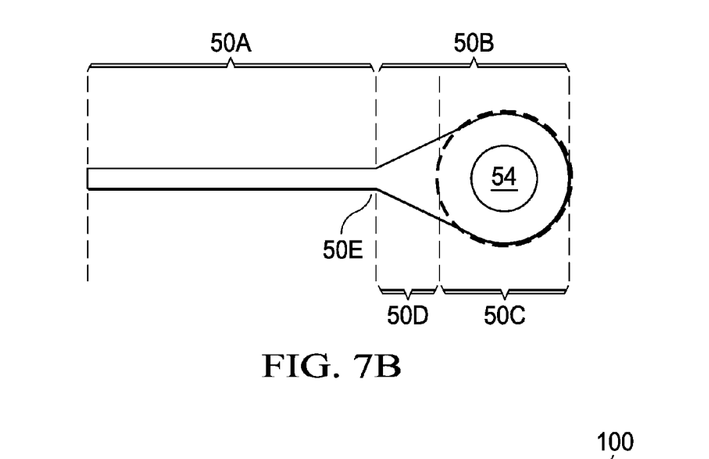

FIGS. 7A and 7B illustrate the application of flux 54 on PPI pads 50B in accordance with some embodiments. Referring to FIG. 7A, stencil 53 is placed over wafer 100, with openings (filled by the illustrated flux layers 54) in the stencil being aligned to the center regions of PPI pads 50B. Flux 54 is then applied on PPI pads 50B through stencil printing, which may include applying flux 54 on stencil 53, and then wiping out excess flux. The portions of flux 54 left in the stencil openings are thus applied on PPI pads 50B.

FIG. 7B illustrates a top view of the applied flux layers 54 and the respective PPI pad 50B. In some embodiments, flux layers 54 are applied as having round shapes (FIG. 7B), whose diameter may be smaller than about 30 percent of the diameter of main pad region 50C, although flux 54 may be larger or smaller. For example, the diameter of flux layers 54 may be in the range between about 40 μm and about 60 μm, and the diameter of main pad regions 50C may be in the range between about 150 μm and about 250 μm.

Figure 8:
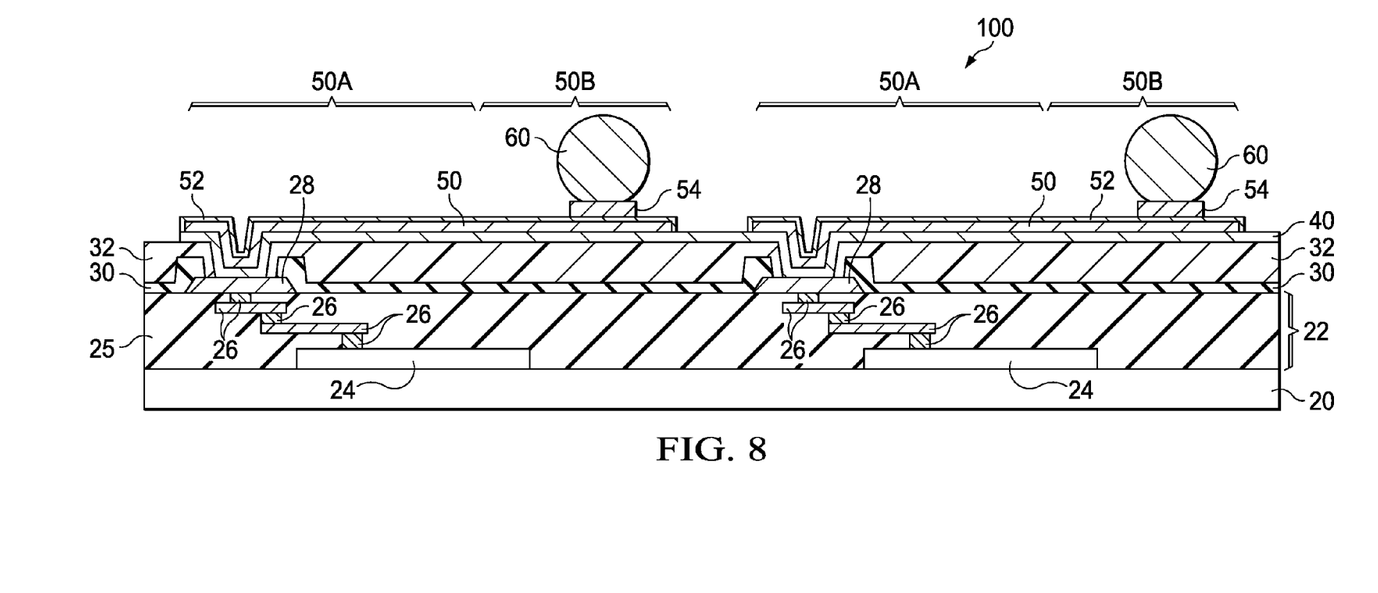

Referring to FIG. 8, solder balls 60 are dropped on flux layers 54. In alternative embodiments, instead of printing flux layers 54 on PPI pads 50B, solder balls 60 may be sucked by a vacuum suction plate (not shown), which includes a plurality of holes whose positions correspond to the positions of PPI pads 50B. The vacuum suction plate may suck and lift up solder balls 60. Flux is then applied to the bottoms of the solder balls 60 (for example, by dipping into a flux-containing plate), followed by dropping solder balls 60 onto PPI pads 50B. Solder balls 60 may be formed of a Sn—Ag alloy, a Sn—Ag—Cu alloy, or the like, and may be lead-free or lead-containing.

Wafer 100 then goes through a reflow process, and solder balls 60 are reflowed. In accordance with some embodiments, the reflow is performed using convection reflow. During the reflow, flux layers 54 remove the portions of metal oxide layer 52, which portions are directly in contact with flux layers 54. The respective oxide removal process is thus referred to as a local oxide removal. With the proceeding of the reflow, the sizes of flux layers 54 may expand outwardly from where flux layers 54 are applied (refer to FIG. 7B), and hence more portions of oxide layers 52 are removed.

Figure 9A:
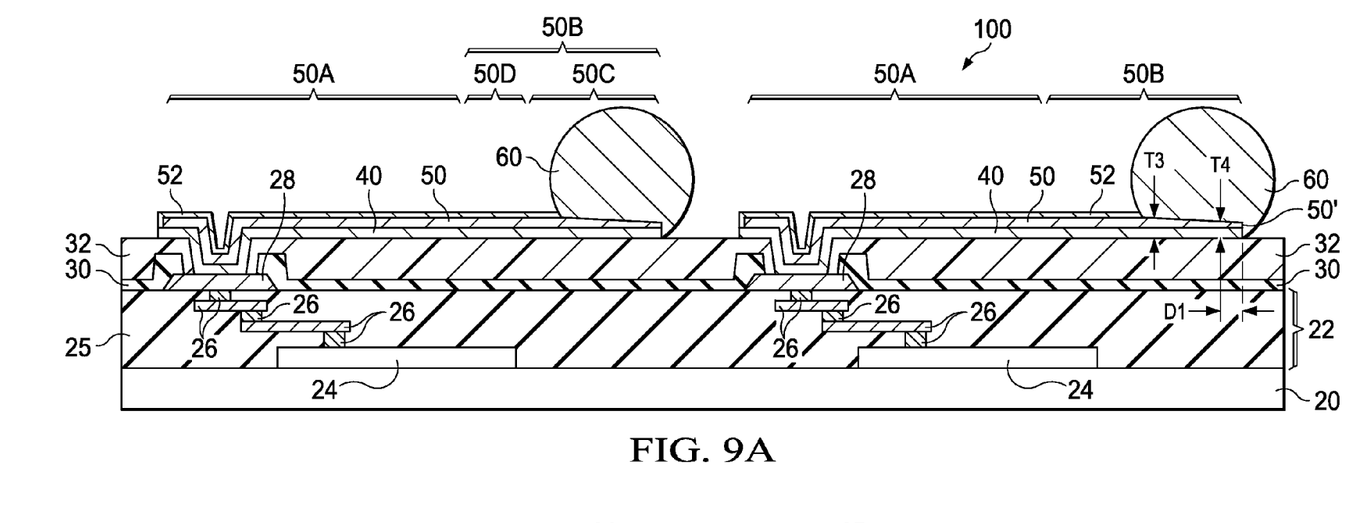
Figure 9B:
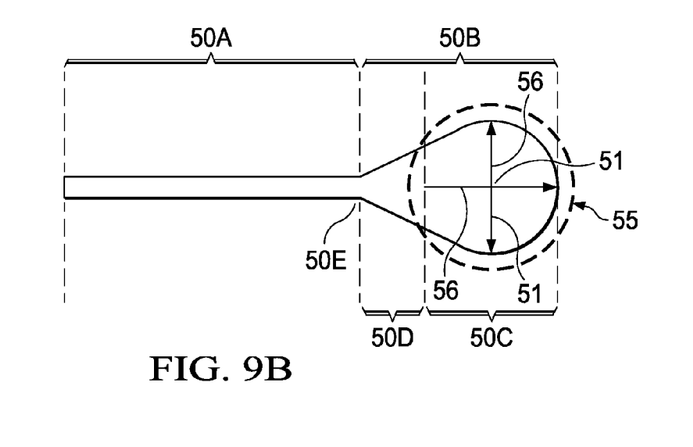

In some embodiments, as shown in FIG. 9A, the removed portions of oxide layer 52 include the portions on the sidewalls of PPI pads 50. The reflow process and the amount of flux 54 are controlled, so that the oxide-removed regions do not extend to neck region 50E (FIG. 7B), although some portions of oxide layer 52 overlapping bird-beak region 50D may be removed. FIG. 9B schematically illustrates region 55, wherein the portions of oxide layer 52 inside region 55 may be removed, and the portions of oxide layer 52 outside region 55 may remain not removed. After the reflow, the residue of flux 54 is removed.

The portions of the surfaces of PPI pad 50, from which some portions of oxide layer 52 is removed, are wettable to solder. Hence, the molten solder balls 60 extend to contact the portions of the surfaces of PPI pads 50B that do not have metal oxide layer 52 thereon. On the other hand, metal oxide layer 52 is not wettable to the molten solder, and hence the un-removed portions of metal oxide layer 52 act as a stopper for preventing the molten solder to expand its territory. Accordingly, the local oxide removal process is used to limit the boundaries of solder balls 60.

As shown in FIG. 9A, after the reflow, the portions of PPI pads 50 may have different thicknesses. For example, as shown in FIG. 9A, thickness T3 is the thickness of the portion of PPI pad closer to PPI line 50A, and thickness T4 is the thickness of the edge portion of PPI pad farther away from PPI line 50A. Thickness T3 is greater than thickness T4. In some embodiments, thickness T3 and thickness T4 have a difference (T3−T4) greater than about 0.5 μm. Thickness difference (T3−T4) may also be in the range between about 0.5 μm and about 2 μm. It is appreciated that at the top surfaces and sidewall surfaces of PPI pads 50B may form corners, which corners may be rounded. Thickness T4 is measured outside the rounded corners. For example, thickness T4 may be measured at a location spaced apart from edge 50' (FIG. 9A) of PPI pad 50B by distance D1, wherein distance D1 may be greater than about 5 μm.

Referring again to FIG. 9B, arrows 56 illustrate the directions in which the thicknesses of PPI pads 50B reduce. In some embodiments, the reduction in the thicknesses of PPI pads 50 in directions 56 is gradual and continuous. Hence, PPI pads 50B have non-planar surfaces that are slanted. The difference in the thicknesses of PPI pads 50 may be partially caused by the uneven oxidation of PPI pads 50 during the oxidation step, wherein the edge portions of PPI pads 50B are oxidized more than the inner portion of PPI pads 50B due to the lateral oxidation. The thicknesses of the remaining portions of PPI pads 50B thus become uneven.

In accordance with some embodiments, after the reflow, an oxide removal process is performed using an etchant that attacks metal oxide layer 52, but does not attack PPIs 50. In alternative embodiments, the oxide removal process is skipped, as shown in FIGS. 11 through 13.

Figure 11:
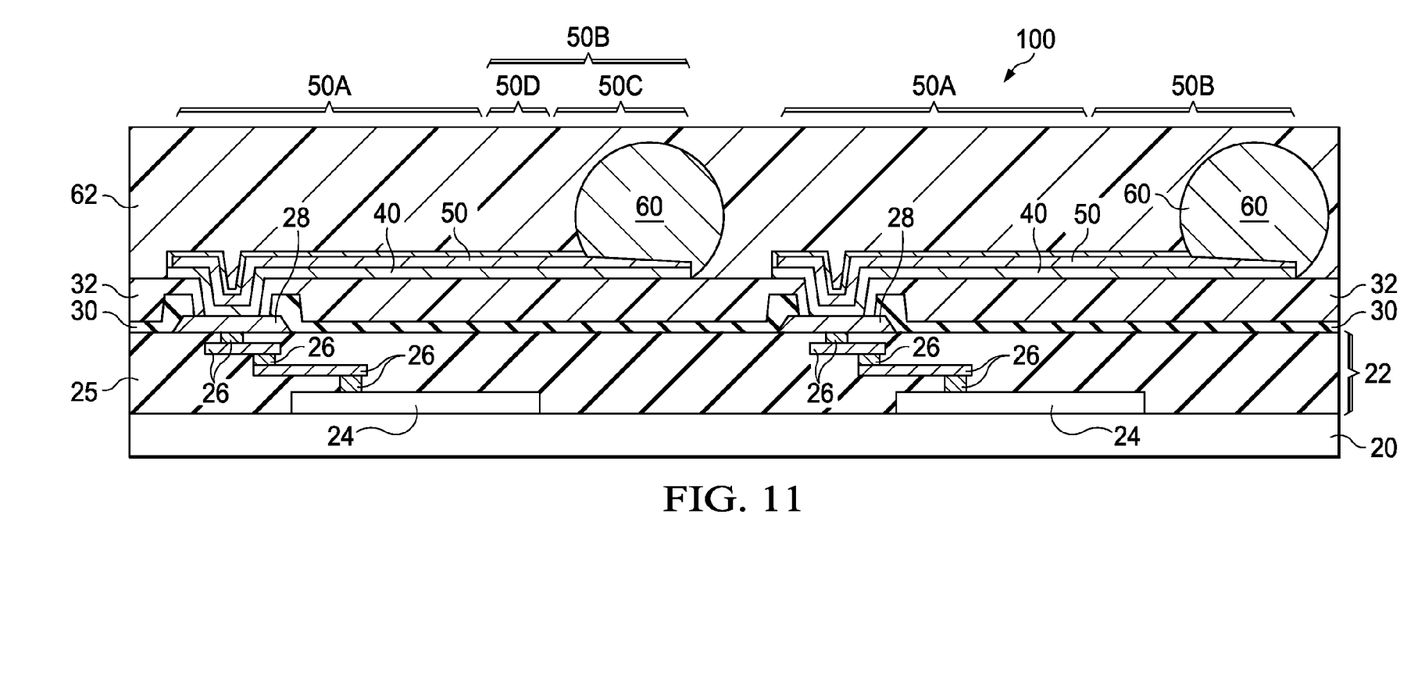

Next, as shown in FIG. 11, molding compound 62 (sometimes referred to as a liquid molding compound due to its low viscosity) is applied on wafer 100, wherein solder balls 60 are submerged in liquid molding compound 62. Liquid molding compound 62 is applied in the form of a liquid such as gel.

Figure 12:
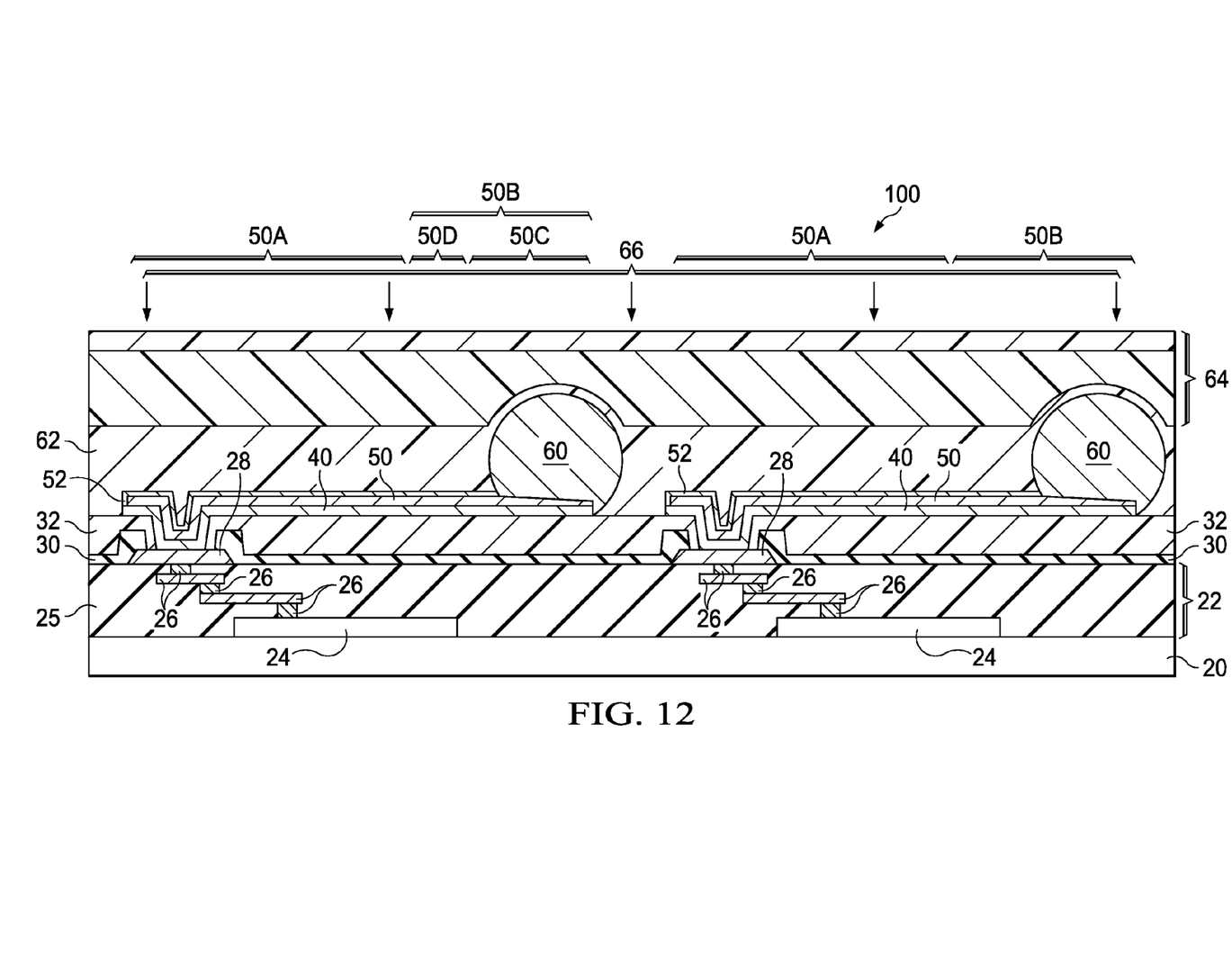
Figure 13:
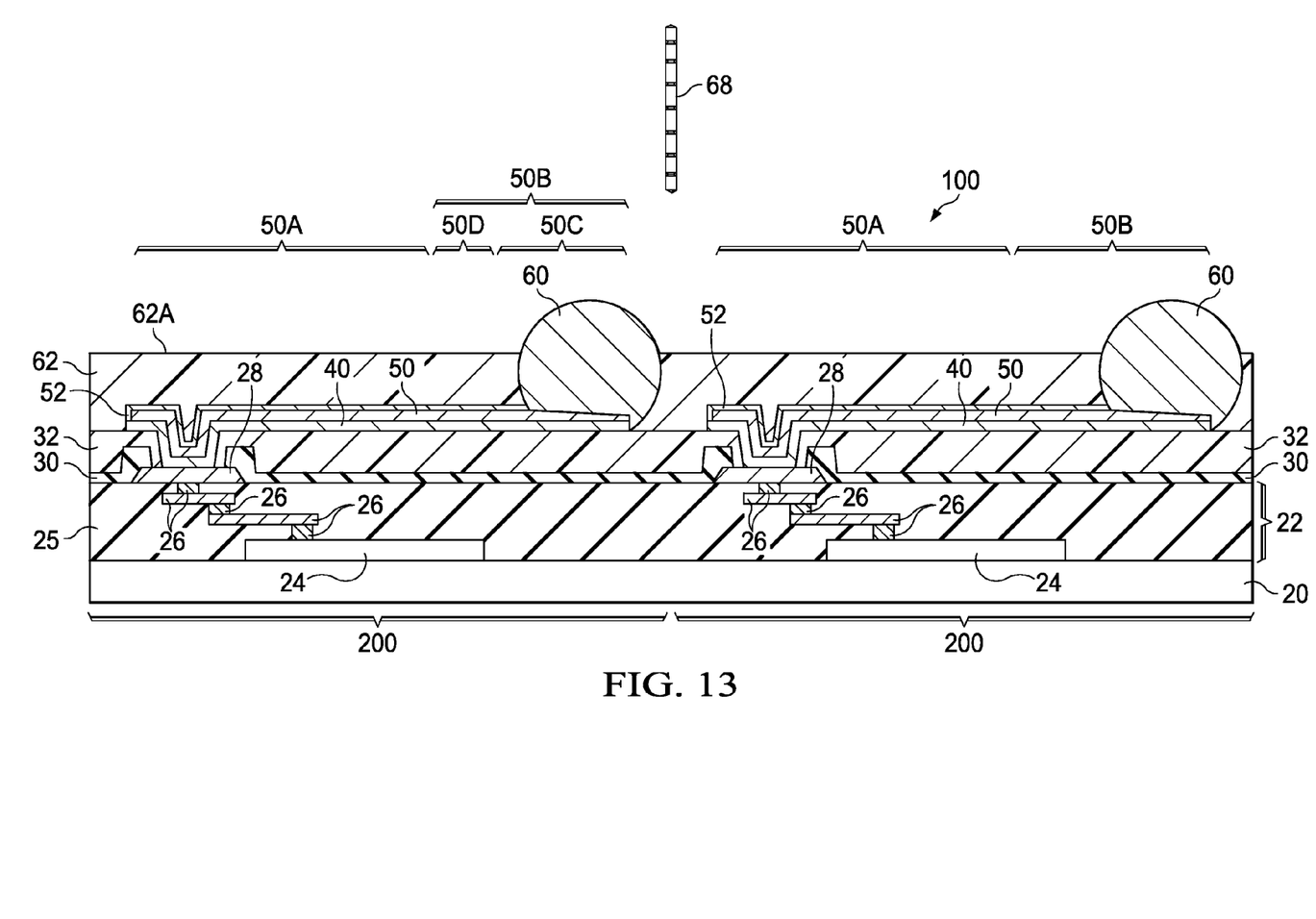

Referring to FIG. 12, release film 64 is applied on liquid molding compound 62. A pressure, as shown as arrows 66, is applied on release film 64. Release film 64 is formed of a soft material, so that the top portions of solder balls 60 are pressed into release film 64. Furthermore, release film 64 pushes some of liquid molding compound 62 away from the top surface of wafer 100, and the bottom surface of release film 64 is lower than the top ends of solder balls 60. With release film 64 remaining being pushed against solder bump 60 and liquid molding compound 62, a curing step is performed to cure and solidify liquid molding compound 62. Liquid molding compound 62, after being solidified, is referred to as molding compound 62 hereinafter. In some embodiments, the curing is performed at a temperature between about 140° C. and about 160° C., for example, for a period of time between about 3 minutes and about 10 minutes. The curing temperature may be adjusted depending on the material of molding compound 62. After the solidification of molding compound 62, the top ends of solder balls 60 protrude out of the top surface of the major portions of molding compound 62. In some embodiments, molding compound 62 has a thickness greater than about 50 µm.

Release film 64 is then peeled off from molding compound 62, which is now in a solid form. The resulting structure is shown in FIG. 13. The residue of molding compound 62 remaining on the top surfaces of solder balls 60 is then removed. In some embodiments, the residue of molding compound 62 is removed through a plasma cleaning step, in which the plasma of process gases such as argon is used to bombard the residue of molding compound 62. In alternative embodiments, the residue of molding compound 62 is removed through etching. In the resulting structure, the bottom portions of solder balls 60 are buried in molding compound 62. The top ends of solder balls 60 may be higher than top surface 62A of molding compound 62. The top portions of solder balls 60 above molding compound 62 may remain to have spherical surfaces, or rounded surfaces close to spherical surfaces.

FIG. 13 also illustrates the die saw step performed on wafer 100, and hence a plurality of dies 200 is sawed from wafer 100. In accordance with some embodiments, the die saw is performed without performing laser grooving on wafer 100. The die saw is performed using blade 68, which saws through molding compound 62, polymer layer 32, passivation layer 30, and underlying interconnect structure 22 and substrate 20.

Figure 10:
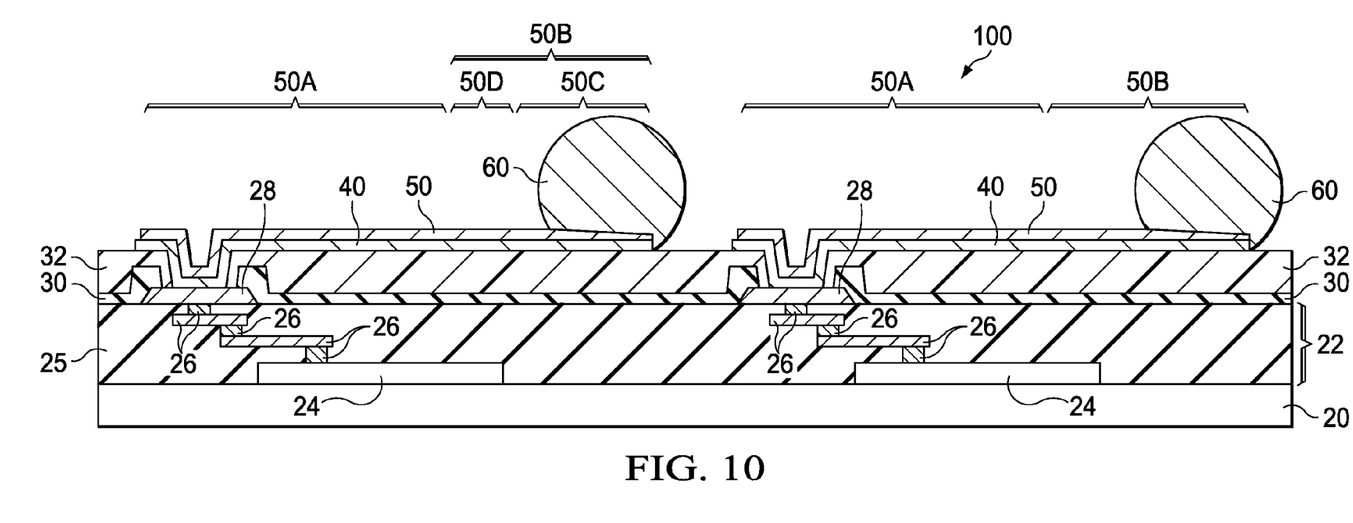

In some embodiments as shown in FIG. 13, thick oxide layer 52 separates PPIs 50 from molding compound 62. In alternative embodiments in which an oxide removal (FIG. 10) is performed, there is substantially no metal oxide separating PPIs 50 from molding compound 62, wherein the native oxide, if any, formed after the oxide removal as shown in FIG. 10 will be smaller/thinner than about 0.2 µm.

In the embodiments of the present disclosure, through the oxidation to form a thick oxide on PPI, and further through the local oxide removal step during the reflow, the wettable surfaces of PPIs are limited in the bird-beak regions and the main pad regions of the PPI pads. The wettable surfaces thus do not extend to the neck regions of the PPIs. Experiment results indicated that when the wettable surface extend to the neck regions, and solder balls extend to the neck regions as a result, cracks may occur in the molding process, causing the PPI lines to be broken from the respective PPI pads. Hence, by limiting the solder balls from reaching the neck regions, the reliability of the PPIs is improved.

In accordance with some embodiments, an integrated circuit structure includes a semiconductor substrate, a metal pad over the semiconductor substrate, a passivation layer including a portion over the metal pad, a polymer layer over the passivation layer, and a Post-Passivation Interconnect (PPI) over the polymer layer. The PPI is electrically connected to the metal pad. The PPI includes a PPI line have a first width, and a PPI pad having a second width greater than the first width. The PPI pad is connected to the PPI line. The PPI pad includes an inner portion having a first thickness, and an edge portion having a second thickness smaller than the first thickness.

In accordance with other embodiments, an integrated circuit structure includes a semiconductor substrate, a metal pad over the semiconductor substrate, a passivation layer over the metal pad, a polymer layer over the passivation layer, and a PPI electrically connected to the metal pad. The PPI includes a PPI line have a first width, and a PPI pad having a second width, wherein the PPI pad is connected to the PPI line, with the PPI line and the PPI pad being overlying the polymer layer. A solder ball is overlying and contacting a first portion of the PPI pad. A metal oxide layer is overlying and contacting the PPI line and a second portion of the PPI pad. The metal oxide layer includes an oxide of the PPI. The second portion of the PPI pad connects the PPI line to the first portion of the PPI pad. The metal oxide layer has a thickness greater than about 1 µm.

In accordance with yet other embodiments, a method includes forming a passivation layer having a portion over a metal pad, wherein the metal pad is further overlying a semiconductor substrate. The method further includes forming a polymer layer over the passivation layer, patterning the polymer layer to expose the metal pad, and forming a PPI electrically connected to the metal pad. The PPI includes a PPI line have a first width, and a PPI pad having a second width greater than the first width, wherein the PPI pad is connected to the PPI line. The method further includes performing an oxidation on the PPI to form a metal oxide layer on the PPI, applying a flux over the metal pad, placing a solder ball over and contacting the flux, and reflowing the solder ball.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
a semiconductor substrate;
a metal pad over the semiconductor substrate;
a passivation layer comprising a portion over the metal pad;
a polymer layer over the passivation layer;
a Post-Passivation Interconnect (PPI) over the polymer layer, wherein the PPI is electrically connected to the metal pad, wherein the PPI comprises:
a PPI line have a first width; and
a PPI pad having a second width greater than the first width, wherein the PPI pad is connected to the PPI line, and wherein the PPI pad comprises an inner portion having a first thickness, and an edge portion having a second thickness smaller than the first thickness;
a solder region overlying a first portion of the PPI pad; and
a metal oxide layer over and contacting the PPI line and a second portion of the PPI pad, wherein the metal oxide layer comprises an oxide of a metal of the PPI line, and wherein the second portion of the PPI pad is between the PPI line and the first portion of the PPI pad.

2. The integrated circuit structure of claim 1, wherein the second thickness is measured at a location spaced apart from a respective edge of the PPI pad by a distance greater than about 5 µm.

3. The integrated circuit structure of claim 1, wherein the metal oxide layer has a thickness greater than about 0.4 µm.

4. The integrated circuit structure of claim 1 further comprising:
a molding compound molding a lower part of the solder region therein, wherein an upper part of the solder region protrudes above the molding compound.

5. The integrated circuit structure of claim 1, wherein the metal pad comprises:
a round main pad region having a center; and
a bird-beak region connecting the round main pad region to the PPI line, wherein widths of the bird-beak region are continuously reduced from a first interface between the bird-beak region and the round main pad region to a second interface between the bird-beak region and the PPI line.

6. The integrated circuit structure of claim 5, wherein the center of the round main pad region has a thickness greater than thicknesses of edge portions of the round main pad region.

7. The integrated circuit structure of claim 1, wherein the PPI line and the PPI pad are formed of a same material, and wherein the same material extends through an entirety of the inner portion and an entirety of the edge portion.

8. An integrated circuit structure comprising:
a semiconductor substrate;
a metal pad over the semiconductor substrate;
a passivation layer over the metal pad;
a polymer layer over the passivation layer;
a Post-Passivation Interconnect (PPI) electrically connected to the metal pad, wherein the PPI comprises:
a PPI line have a first width; and
a PPI pad having a second width greater than the first width, wherein the PPI pad is connected to the PPI line, with the PPI line and the PPI pad being overlying the polymer layer;
a solder region over and contacting a first portion of the PPI pad; and
a metal oxide layer over and contacting the PPI line and a second portion of the PPI pad, wherein the metal oxide layer comprises an oxide of the PPI, wherein the second portion of the PPI pad connects the PPI line to the first portion of the PPI pad, and wherein the metal oxide layer has a thickness greater than about 0.4 µm.

9. The integrated circuit structure of claim 8, wherein different portions of the PPI pad have different thicknesses.

10. The integrated circuit structure of claim 9, wherein differences between the different thicknesses are greater than about 0.5 µm.

11. The integrated circuit structure of claim 8, wherein an edge of the metal oxide layer is in contact with an edge of the solder region.

12. The integrated circuit structure of claim 8 further comprising a molding compound over and contacting the metal oxide layer.

13. The integrated circuit structure of claim 8, wherein the metal oxide layer comprises copper oxide.

14. The integrated circuit structure of claim 8, wherein the PPI pad comprises an inner portion having a first thickness, and an edge portion having a second thickness smaller than the first thickness.

15. An integrated circuit structure comprising:
a metallic feature comprising:
a round pad having a diameter;
a metal line having a width smaller than the diameter; and
a transition region connecting the round pad to the metal line, with the transition region having a first interface with the round pad and a second interface with the metal line, wherein from the first interface to the second interface, widths of the transition region reduce gradually, and wherein from a first portion of the round pad to a second portion of the round pad, thicknesses of the round pad reduce gradually, with the second portion being farther away from the first interface than the first portion;
a solder region over and contacting an entirety of the round pad and a portion of the transition region, wherein the solder region is spaced apart from the second interface; and
a metal oxide layer over and contacting the metal line and a portion of the transition region, wherein the metal oxide layer comprises an oxide of a material forming the transition region.

16. The integrated circuit structure of claim 15, wherein the metal oxide layer has a thickness greater than about 0.4 µm.

17. The integrated circuit structure of claim 15, wherein the first portion of the round pad has a first thickness, and the second portion of the round pad has a second thickness, with the first thickness being greater than the second thickness by more than about 0.5 µm.

18. The integrated circuit structure of claim 17, wherein the second portion and a respective closest edge of the round pad have a distance greater than about 5 µm.

19. The integrated circuit structure of claim 15, wherein the solder region contacts an edge of the round pad.

20. The integrated circuit structure of claim 15 further comprising a molding compound over and contacting the metal oxide layer.

* * * * *